United States Patent
Pendurkar (10) Patent No.: US 6,684,352 B1
(45) Date of Patent: Jan. 27, 2004

(54) READ CONTROL SYSTEM AND METHOD FOR TESTING WORD ORIENTED SRAM WITH MACROS

(75) Inventor: Rajesh Y. Pendurkar, Sunnyvale, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 524 days.

(21) Appl. No.: 09/614,418

(22) Filed: Jul. 12, 2000

(51) Int. Cl.[7] .......................... G11C 29/00; G06F 12/00
(52) U.S. Cl. .................... 714/718; 711/104; 711/154
(58) Field of Search ................... 714/718, 701, 714/702, 5, 719, 783; 711/1, 2, 3, 5, 100, 104, 114, 117, 118, 119, 120, 127, 147, 148, 149, 154, 157

(56) References Cited

U.S. PATENT DOCUMENTS

| | | | | |
|---|---|---|---|---|
| 5,295,252 A | * | 3/1994 | Torii et al. ................. | 711/127 |
| 5,517,666 A | * | 5/1996 | Ohtani et al. ............... | 395/800 |
| 5,604,756 A | * | 2/1997 | Kawata ...................... | 371/67.1 |
| 6,370,628 B2 | * | 4/2002 | Beppu ........................ | 711/163 |
| 6,510,486 B1 | * | 1/2003 | Knaack et al. ................ | 711/5 |

* cited by examiner

Primary Examiner—Christine T. Tu
(74) Attorney, Agent, or Firm—Martine & Penilla, LLP (57) ABSTRACT

The present invention provides a system and method for reading a SRAM unit having a first SRAM way and a second SRAM way with a read control system, a way select macro and a word select macro. The word select control macro is configured to select one of the plurality of words. The way select control macro is configured to select either the first SRAM way or the second SRAM way. The system and method employ a read logic controller having a word select function and a way select function. The read logic controller is operatively coupled to a read counter, a word counter, and an address counter.

13 Claims, 4 Drawing Sheets

READ CONTROL SYSTEM AND METHOD FOR TESTING WORD ORIENTED SRAM WITH MACROS

BACKGROUND OF THE INVENTION

1. Field of the Invention

The present invention relates to performing read operations in static random access memory (SRAM). More particularly, the present invention relates to performing read operations within an SRAM having a way select control macro and a word select control macro.

2. The Background Art

The 6N march test algorithm is used to test internal RAM data integrity at the CPU manufacturing and debug stage and for field testing and diagnostic testing. The 6N march test consists of six(6) read/write cycles which are conducted by three march elements. Those with ordinary skill in the art shall appreciate that the six read/write operations are identified as:

$\uparrow W_o, \uparrow(R_o W_1), \downarrow(R_1 W_o R_o)$

The first march element ($\uparrow W_o$) writes a particular data background of ones and zeros into the SRAM. The first march element writes addresses from lower to higher memory addresses. The write operation of the first march element is identified as $W_o$. The upward arrow, $\uparrow$, is used to designate performing either read or write operations from lower to higher memory addresses.

The second march element, $\uparrow(R_o W_1)$, performs its read and write operations by reading and writing from the lower memory addresses to the higher memory addresses. During the first operation of the second march element, the data background from the first march test is read. This first operation of the second march element is identified as $R_o$. During the second operation of the second march element, the complement of the data background is written to the SRAM addresses. The second operation of the second march element is identified as $W_1$. The complement of the data background is tested to verify that the SRAM cells containing a one can store a zero and vice versa.

The third march element, $\downarrow(R_1 W_o R_o)$, performs its read and write operation by reading and writing from the higher memory addresses to the lower memory addresses. The downward arrow, $\downarrow$, is used to represent performing read and write operations from higher to lower memory addresses. During the first operation of the third march element, the data background from the write complement, $W_1$, completed in the previous march element is conducted. This first operation of the third march element is identified as $R_1$. During the second operation of the third march element, the original data background is written back to the same memory locations. This second operation of the third march element is identified as $W_0$. During the third operation of the third march element, the original data background is read from the same memory locations to verify the contents of each location. This third operation is identified as $R_0$.

The 6N test algorithm provides a diagnostic tool for determining memory failure. When performing the 6N test algorithm, the timing for writing the test data background is determined by a scan clock signal which does not operate at the CPU operating speed. By way of example, for a 400 MHz processor, the scan clock generally operates at 50 MHz. The slower scan clock cycle presents a substantial limitation because speed related faults in the SRAM are not tested at its operating speed. Therefore, it would be beneficial to provide a memory test algorithm which can operate at the same clock cycle as the CPU.

Figure 1:
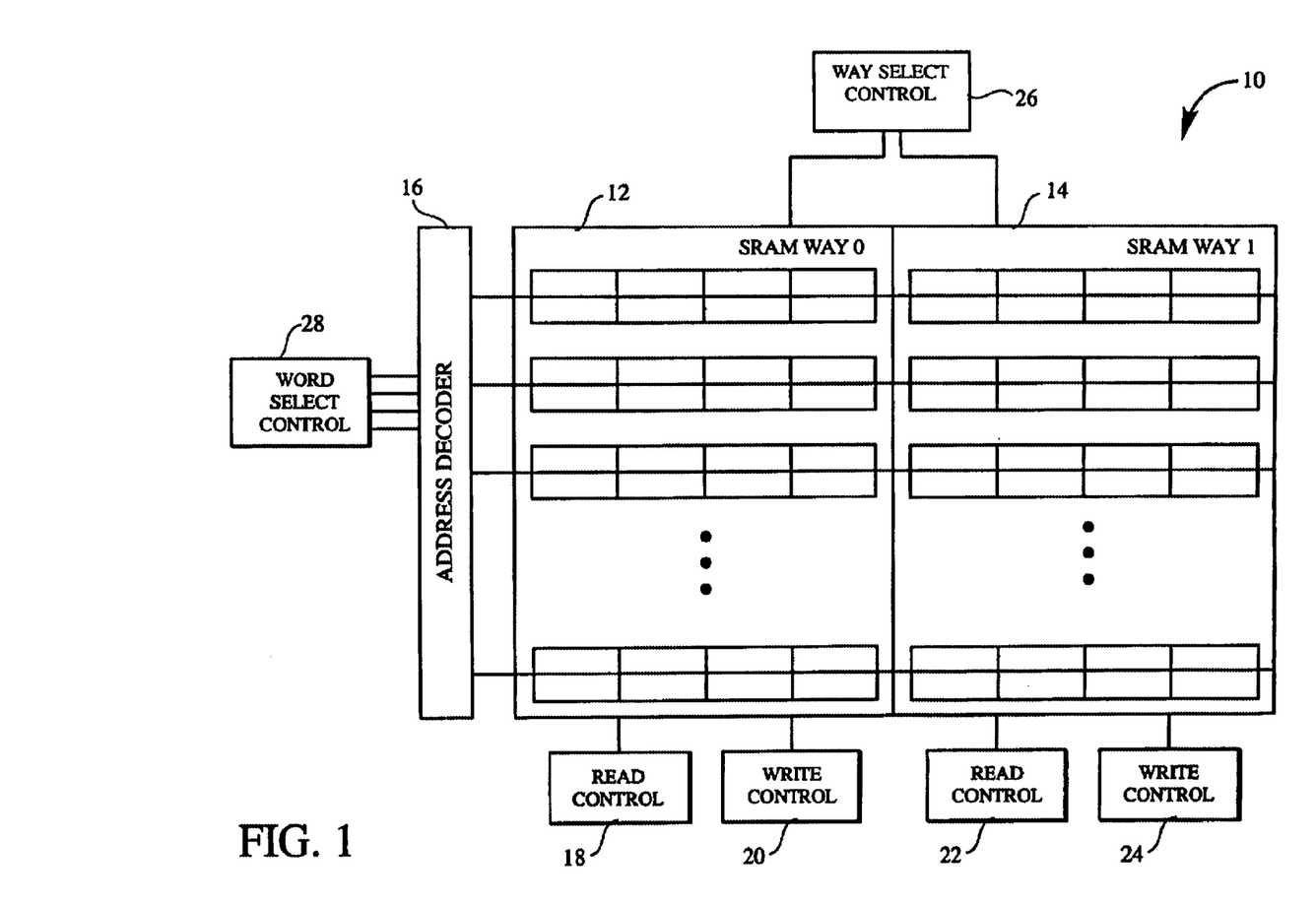
FIG. 1 is an illustrative block diagram of a prior art testing apparatus having one input data register which is scanned into SRAM.

Referring to FIG. 1, there is shown an illustrative SRAM unit 10 having a first memory bank or way 12, identified as SRAM Way 0 and a second memory bank or way 14, identified as a SRAM Way 1. The address decoder 16 is coupled to the SRAM Way 0, 12, and SRAM Way 1, 14. The address decoder 16 receives read address signals and write address signals for both ways. Each way or bank has an associated read control module and write control module. More particularly, a read control module 18 and a write control module 20 is coupled to the SRAM Way 0, 12. Additionally, read control module 22 and write control module 24 is coupled to SRAM Way 1, 14.

Each write control module 20 and 24 includes a write enable control function and a plurality of write data ports. The write data ports write data to the cells or addresses into the SRAM unit 10. The read control module 18 and 22 includes a plurality of read data ports which read the cells or addresses in each way.

It shall be appreciated by those of ordinary skill in the art that the illustrative SRAM unit 10 includes a row of storage cells, in which each row has one or more words. Each word is comprised of a plurality of bits. The SRAM unit stores binary information in these groups of bits which make up each word. The word is a group of bits that move in and out of storage as a unit.

During write operations of each SRAM way, a write operation is completed by writing 'n' bits to each address for each SRAM way. Each address is identified by the row of bits within each SRAM way. Read operations are performed differently from write operations. During read operations, the read operation is performed sequentially for each word within the row. Therefore, by way of example and not of limitation, data is read in sets of 'n/4', i.e. n bits divided by 4 words. To further illustrate the differences between write and read operations, it shall be appreciated by those skilled in the art that for a 256 bit write operation, a read operation would be performed with four (4) 64 bit write operations.

The different method for performing read operations and write operations creates problems when performing memory test algorithm. Memory test algorithms are used to provide high perfomance test algorithms for static random access memory (SRAM) components. An illustrative example of a variety of memory test algorithms include the 2N, 6N or 12N march test algorithms are used to test SRAM components. By way of example and not of limitation, the 6N march test algorithm uses a specific data background and the complement of the specific data background in a read/write manner which is described in further detail below.

Figure 2:
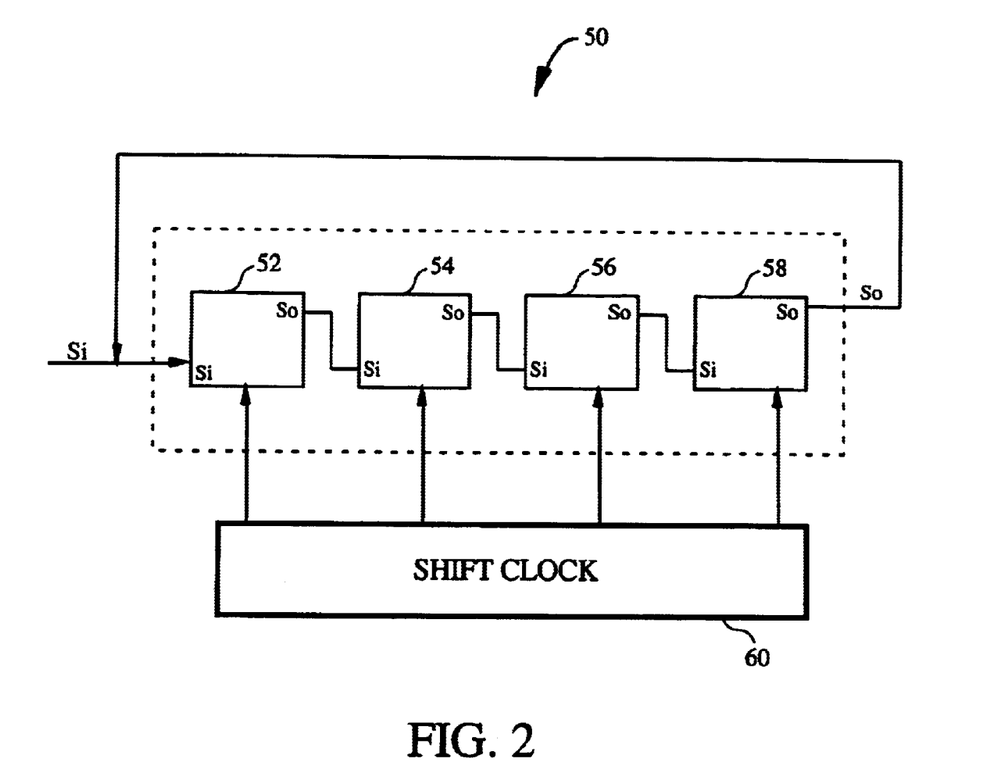
FIG. 2 is an illustrative block diagram of macro having four flip-flops.

Referring to FIG. 2 there is shown an illustrative "macro" 50 having four embedded flip-flops 52, 54, 56 and 58. The macro has a scan-in port and scan-out port accessible to the CPU only at the macro boundary flip-flops 52 and 58. More particularly, the macro 50 consists of four embedded flip-flops 52, 54,56 and 58 which are serially coupled. The first flip-flop 52 has a scan-in port that is accessible by other components and the fourth flip-flop 58 has a scan-out port that is accessible by other components. The internal coupling of the second flop 54 and the third flop 56 are not accessible. The internal coupling for the four flop macro is accomplished by coupling the first flip-flop 52 scan-out port to a scan-in port of a second flip-flop 54, coupling the second flip-flop 54 scan-out port to the scan-in port of a third flip-flop 56, coupling the third flip-flop 56 scan-out port to the scan-in port of the fourth flip flop 58.

It shall be appreciated by those skilled in the art, that each flip-flop within the macro has receives an associated clocking signal from a shift clock 60. The clocking signal "shifts" the binary data stored in each flop to the right or to the left. The clocking signal for each flip flop is determined by a shift clock 60. The ability to control the clocking signal within each flip-flop with a shift clock is well known in the art, and is generally referred to as a shift clock.

Macros are predesigned and optimized to improve timing in the CPU. By way of example and not of limitation, a macro may include 4 to 16 flip-flops. If an input data register consists of macros instead of individual flops, the recreation of a data background by feeding the same state back into the individual flip flop is not possible. The inability to feed the same state back to the individual flops in the macro is because there are no scan-in or scan-out ports for flip flops embedded inside the macro.

Referring back to FIG. 1, the SRAM unit 10 may be configured to include a macro 26 for way select control and a separate macro 28 for word select control. The way select control macro 26 and the word select control macro are resident to the SRAM unit and are operatively coupled to the SRAM unit 10.

However, a system and method for employing a way select macro to read the proper way is not known. Additionally, a system and method for employing a word select macro to read the proper word is not known.

Accordingly there is a need for employing a way select macro to read the proper way in a SRAM unit. Additionally there is a need for providing proper shifting to control the way select control macro. Therefore, it would be beneficial to provide a system and method for properly shifting and enabling a way select control macro.

Furthermore, there is a need for employing a word select macro to read the proper word in a SRAM unit. Additionally there is a need for providing proper shifting to control the word select control macro. Therefore, it would be beneficial to provide a system and method for properly shifting and enabling a word select control macro.

Further still, it would also be beneficial to provide a system and method for performing read operations for a march test algorithm for an SRAM having a way select control macro and/or a word select control macro.

It would further be beneficial to provide a system and method for performing march test algorithms on an SRAM having a way select control macro and/or a word select macro.

SUMMARY OF THE INVENTION

The present invention provides a system for reading a SRAM unit, including a first SRAM way and a second SRAM way housed within the SRAM unit with a read control system. The first SRAM way has a first read control module coupled to the first SRAM way. The second SRAM way has a second control module coupled to the second SRAM way. The read control system is coupled to the first read control module and the second read control module, and the read control system is configured to establish proper way select read control and proper word select read control using a word select control macro and a way select control macro.

The present invention also provides a method for reading an SRAM unit having at least two ways in which each way has a plurality of rows, each row has a plurality of words, and each word has a plurality of memory bits. The SRAM unit includes a way select control macro configured to select one of said at least two ways. The SRAM unit also includes a word select control macro configured to select one of the plurality of words. The method includes engaging a word counter having a word counter cycle, an address counter having an address counter cycle, and a read counter having a read counter cycle. The method then proceeds to determine whether a read counter cycle is complete and conducts a read operation when the read counter cycle is complete performs proper way select control. The method then determines whether a word counter cycle is complete and performs read operations for the next row when the word counter cycle is complete.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons having the benefit of this disclosure.

Figure 3:
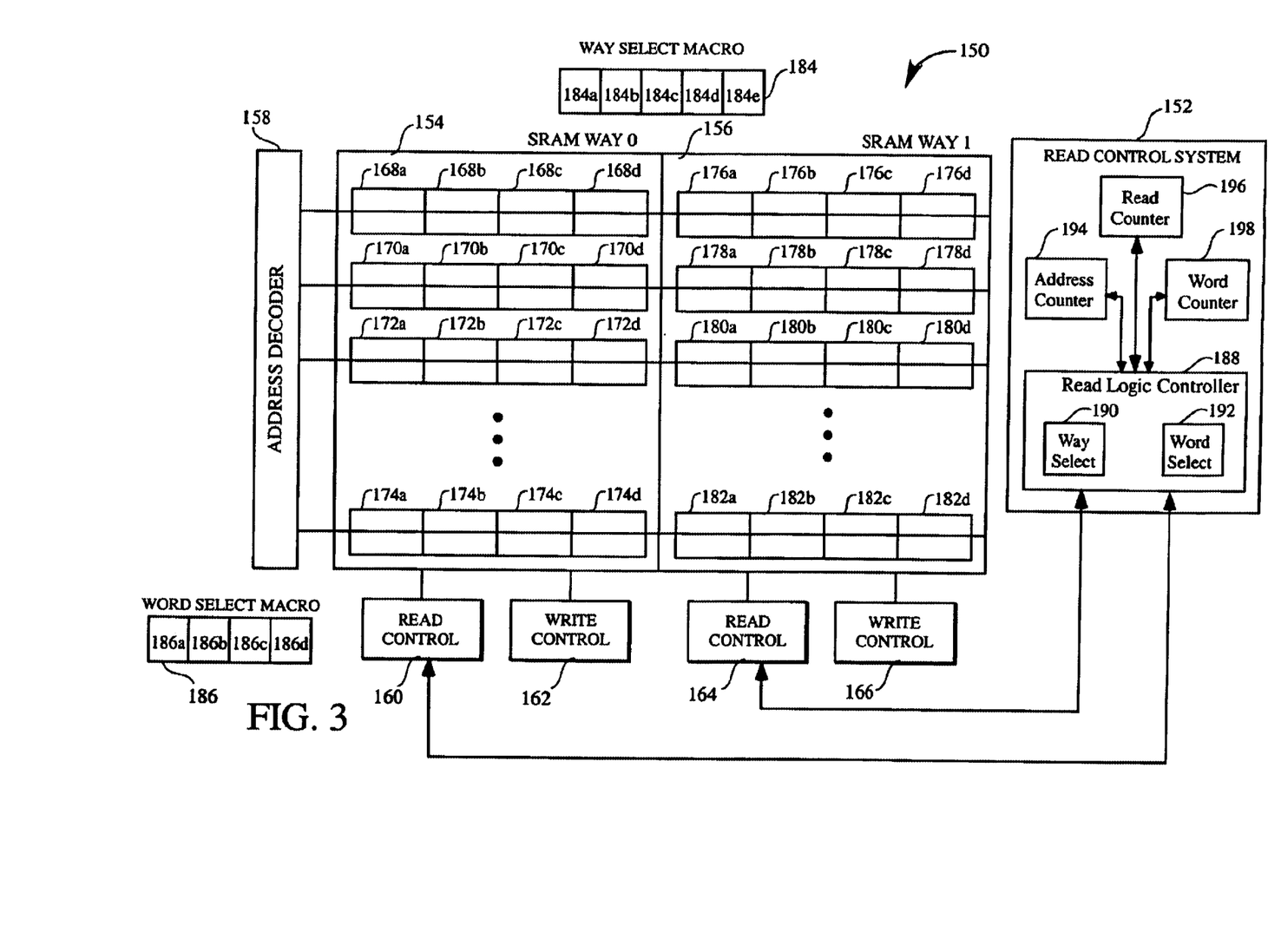
FIG. 3 is a block diagram of the system of the present invention.

Referring to FIG. 3, there is shown a block diagram of the system for the present invention which includes an SRAM unit 150 having and a read control system 152. The SRAM unit 150 includes a first memory bank or way 154, identified as SRAM Way 0 and a second memory bank or way 156, identified as a SRAM Way 1. The address decoder 158 is coupled to the SRAM Way 0, 154, and SRAM Way 1, 156. The address decoder 158 receives read address signals and write address signals for both ways. Each way or bank has an associated read control module and write control module. More particularly, a read control module 160 and a write control module 162 is coupled to the SRAM Way 0. Additionally, read control module 164 and write control module 166 is coupled to SRAM Way 1 156.

Each write control module 162 and 166 includes a write enable control function and a plurality of write data ports (not shown). The write data ports write data to the cells or addresses into the SRAM unit 150. The read control module 160 and 164 includes a plurality of read data ports (not shown) which read the cells or addresses in each way.

It shall be appreciated by those of ordinary skill in the art that the illustrative SRAM unit 150 includes two ways, in which each way includes a plurality of rows of storage cells 168 through 182. Each row has one or more words. For illustrative purposes, there are four words for each row. The words included in each row are identified by the designation "a", "b", "c" and "d". By way of example, for row 168 associated with SRAM Way 0, 154, the four words for the row 168 are identified as 168a, 168b, 168c and 168d. Those of ordinary skill in the art shall appreciate that each word is comprised of a plurality of bits. The SRAM unit 150 stores binary information in these groups of bits which make up each word. The word is a group of bits that move in and out of storage as a unit.

The SRAM unit 150 includes a way select control macro 184 operatively coupled to the SRAM unit 10. In other words, resident on SRAM unit 150 is a macro 184 configured to provide way select control. Using a one-hot encoding method well known to those skilled in the art, the way select control macro is used to determine proper selection of the proper way or memory bank. For proper way selection during read operations, the illustrative four word which make up a row requires a way select macro having five flip-flops. The five flip-flops are identified as flops 184a, 184b, 184c, 184d and 184e. As previously described, a macro of fixed size provides no access to scan-in and scan-out ports of flip-flops except for those on the boundary of the macro. The use and basis for the five flip-flops will be described below in more detail.

The SRAM unit 150 includes a word select control macro 186 operatively coupled to SRAM unit 150. In other words, resident on SRAM unit 150 there is a macro 184 configured to provide word select control. The one-hot encoding method is used during the word select control macro operations. The word select control macro is used to select the proper word in the selected way or memory bank. As previously mentioned, the use of a flip-flop macro of fixed size provides no access to scan-in and scan-out ports of flip-flops except for those on the boundary of the macro. For proper word selection during read operations of the illustrative four word row, a word select macro having four flip-flops is required. A more detailed discussion of the application of the four flip-flop word select macro is provided below.

The read control system 152 is coupled to the read control modules 160 and 164. The read control system 152 comprises a read logic controller 188 having way select function 190 and a word select function 192. The way select function 190 provides communication with way select control macro 184. The word select function 192 provides communication with word select macro 186. The read logic controller is coupled to the read control modules 160 and 164. Additionally the read control system 152 includes an address counter 194, a read counter 196 and a word counter 198, each of these counters being coupled to the read logic controller 188.

The read logic controller 188 is configured to establish proper way select read control and proper word select read control by using the address counter 194, read counter 196 and word counter 198. The address counter 194 is used to track the address values and determine when the way or memory bank is read and when the particular word is prepared to be read. The determination of when the proper way and word are read depends on the values set in the word select control macro 184 and the way select control macro 186. The read counter 196 in conjunction with the address counter 194 is used to count the number of shifts to obtain proper way select control and word select control and make read enable high at the proper time. The word counter 198 is used to count the number of words which have been read for each address line or row. Each of these counters are used in conjunction with the read logic controller 188 to provide way select control function 190 and word select control function 192. Thus each of these counters are provided to track the address values, to track the read enable signals, and to track the number of words. This ensures reading of all words from the same row within the same way at the appropriate time.

As an illustrative example, Table 1 shows the illustrative control output from the read control system 152 which communicates with the SRAM unit 150 having a way select control macro 184 and word select control macro 186 during an element of the march test algorithm.

TABLE 1

| Shift No. | Read Counter | Way Select Control Macro | Word Select Control Macro | Word Counter |
|---|---|---|---|---|
| 1* | read | 00001* | 0001* | 1 |
| 2 | 1 | 00010 | 0010 | |
| 3 | 2 | 00100 | 0100 | |
| 4 | 3 | 01000 | 1000 | |
| 5 | 4 | 10000 | 0001 | |
| 6* | read | 00001* | 0010* | 2 |
| 7 | 1 | 00010 | 0100 | |
| 8 | 2 | 00100 | 1000 | |
| 9 | 3 | 01000 | 0001 | |
| 10 | 4 | 10000 | 0010 | |
| 11* | read | 00001* | 0100* | 3 |
| 12 | 1 | 00010 | 1000 | |
| 13 | 2 | 00100 | 0001 | |
| 14 | 3 | 01000 | 0010 | |
| 15 | 4 | 10000 | 0100 | |
| 16* | read | 00001* | 1000* | 4 |

As shown above, the read control system 152 provides proper values in the way select control macros and word select control macros before the read operations are activated so that all words from each row 168 through 182 are read. More particularly, the first column of Table 1 shows the number of clock shifts generated by the shift clock 60. The read counter 196 counts the number of shifts to obtain proper way select control from the way select control macro 184 and proper word select control from the word select control macro 186.

The second column presents the output from read counter 196. Read counter 196 enables read operations during the first shift and every fifth shift thereafter. Read operations, therefore, occur at shift clock 1, 6, 11 and 16.

The third column provides illustrative way select control output from the way select control macro 184 using the one-hot encoding method. It shall be appreciated by those of ordinary skill in the art that the way select macro is shifted from right to left. The way select control macro output with the asterisk next to the respective macro output determines the selection of the first way. Thus, read operations are performed for the first way at shift clock 1, 6, 11 and 16.

The fourth column provides illustrative word select control output from the word select control macro 184 using the one hot encoding method. During word select operations the words are read from right to left and the reading of each word is conducted one at a time. The word select control output having an asterisk next to the output provides for the selection of the next consecutive word. The read operations are performed for each of the four words in a consecutive manner in which each word is read one at a time. Therefore, the read operation for the far right first word in the first way is conducted at shift clock 1, the read operation for the second word adjacent the far right first word in the first way is conducted at shift clock 6, the read operation for the third word adjacent the second word is conducted at shift clock 11, and the read operation for the fourth word adjacent the third word is conducted at shift clock 16. It shall be appreciated by those skilled in the art having the benefit of this disclosure that the read counter synchronizes the way select control and the word select control with the shift clock so that the proper word within the selected way is read.

The fifth column provides the output from word counter 198. In this particular case, each row consists of four words. The word counter 198 counts the times each of these words are read. Once the word counter value becomes the equivalent of the number of words for each address or row, then all words for the particular address have been read. After all the words for the particular row are read, the system proceeds to performing the same read operations for the next row and the word counter returns to one for the first shift clock associated with the next row.

As an illustrative example, Table 2 shows the illustrative control output from the read control system 152 which communicates with SRAM unit 150 having a way select control macro 184 and word select control macro 186 during an element of the march test algorithm.

TABLE 2

| Shift No. | Read Counter | Way Select Control | Word Select Control | Word Counter |
|---|---|---|---|---|
| 1* | read | 00010* | 0001* | 1 |
| 2 | 1 | 00100 | 0010 | |
| 3 | 2 | 01000 | 0100 | |
| 4 | 3 | 10000 | 1000 | |
| 5 | 4 | 00001 | 0001 | |
| 6* | read | 00010* | 0010* | 2 |
| 7 | 1 | 00100 | 0100 | |
| 8 | 2 | 01000 | 1000 | |
| 9 | 3 | 10000 | 0001 | |
| 10 | 4 | 00001 | 0010 | |
| 11* | read | 00010* | 0100* | 3 |
| 12 | 1 | 00100 | 1000 | |
| 13 | 2 | 01000 | 0001 | |
| 14 | 3 | 10000 | 0010 | |
| 15 | 4 | 00001 | 0100 | |
| 16* | read | 00010* | 1000* | 4 |

Similar to Table 1, Table 2 provides the number of clock shifts for enabling the way select macro 184 and the word select macro 186. The second column presents the output from read counter 196. As described above, the read counter 196 conducts read operations during the first shift and then every fifth shift thereafter. The third column provides the way select control output with the asterisk next to the respective macro output determines the selection of the second way. It shall be appreciated that the table shows the selection of the second way with the way select control macro 184. As previously described, the fourth column provides illustrative word select control output in which the reading of each word is conducted one at a time from right to left. As previously noted, the read counter 196 synchronizes the way select control and the word select control so that read enable is high for the proper way and word. The fifth column provides the word counter value as described above.

To apply a memory test algorithm such as 6N march test algorithm, read and write operations must be engaged at the appropriate times. In the example described above having a 2-way memory with 4 words per address line, the address counter 194 is initiated each time a new address line or row is read. The address counter is generally a timer which counts down or up to a predetermined value by counting the values generated by the shift clock. The timer provides a time within which read operations are to be completed within the address line or row which is being read. If the address counter for the last row is read, then the system provides for reading the next way or proceeding with the next portion of the march test algorithm.

Figure 4:
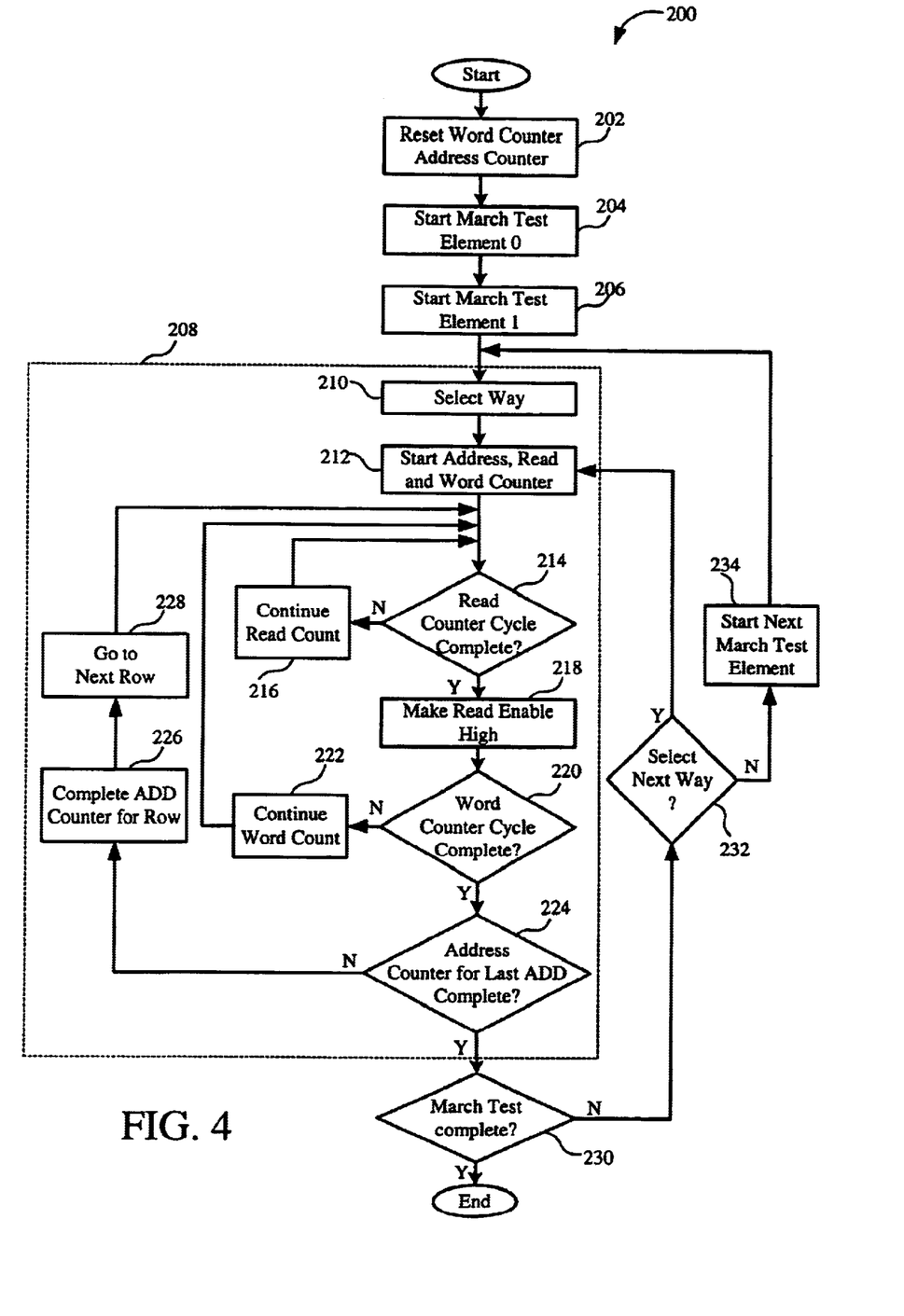
FIG. 4 is a block diagram of the method of the present invention.

Referring to FIG. 4, there is shown a flowchart 200 for performing read operations with a way select macro 184 and word select macro 186. The present invention provides a method for reading an SRAM unit 150 having at least two ways in which each way has a plurality of rows, each row has a plurality of words, and each word has a plurality of memory bits. The SRAM unit 150 includes a way select control macro 184 configured to select one of said at least two ways. The SRAM unit also includes a word select control macro 186 configured to select one of the plurality of words.

Additionally, the method includes engaging a word counter 198, an address counter 194, and a read counter 196. The method determines whether a read counter cycle is complete and conducts a read operation when a read counter cycle is complete. The method provided below may be used to perform read operations in a memory test algorithm such as a 6N march test algorithm. Additionally, the method may also be employed to conduct read operation on an SRAM unit having a way select control macro and word select control macro. For illustrative purposes, read operations for performing a 6N march test algorithm are provided below.

At block 202, the read counter 196, word counter 198 and address counter 194 are reset. As previously described the read counter 196 is used to count the number of shifts to obtain proper way select control and word select control, the word counter 198 is used to count the number of words which have been read for each address line or row, and the address counter 194 is used to track the address lines. The method then proceeds to process 204.

At block 204, the first march test element of writing a data background to the SRAM unit 150 is initiated. As previously described, the data background is written to the entire row or address line at one time. There are no read operations performed during the first march test element. The method then proceeds to block 206.

At block 206, the second march test element is initiated. As previously described, the second march test element requires reading and writing. During the "read" portion of the march test algorithm, process block 208 is initiated.

At block 208, the read operation is performed. The read operation includes the processes 210 through 228 which are described in further detail below. It shall be appreciated by those skilled in the art having the benefit of this disclosure that the read operations provided in block 208 describe the method for performing read operation on an SRAM unit having a way select control macro and word control macro.

At block 210 the method provides for selecting the way or memory bank which will be read. In the illustrative example, a first way 154 and a second way 156 are provided. The way which is selected is determined by the data background in the way select control macro 184 as shown above. The method then proceeds to process 212.

At block 212, the three counters, namely, the address counter 194, read counter 196, and word counter 198 are initiated to perform the read operations. The read logic controller 188 is configured to establish proper way select read control and proper word select read control by using the address counter 194, the read counter 196 and the word counter 198. At block 212, the read operation is enabled for the first shift clock as shown in Table 1 and Table 2. The method then proceeds to decision diamond 214.

At decision diamond 214, it is determined whether the read count for a predetermined number of shifts is complete. If the predetermined number of shifts for the read counter is not achieved, then the method proceeds to block 216. At process block 216, the read counter 196 proceeds to the next shift clock and counts the next shift clock cycle. If the predetermined number of shifts for the read counter cycle is achieved the method provides for resetting the read counter and then the method proceeds to process block 218.

At block 218, the read operation is enabled for the particular way and for a particular word. The particular word is determined by the word select control macro 186 as described above. The method then proceeds to decision diamond 220.

At decision diamond 220, it is determined whether the word counter cycle is complete. If the word counter cycle is not complete, then the method proceeds to block 222. At process block 222, the word counter 198 continues to perform the word count operations of counting word which have been read from the address line or row. If all the words in the row have been counted, the word counter is reset and the method then proceeds to decision diamond 224.

At decision diamond 224, it is determined whether the address counter 194 for the last address line or row has reached a pre-defined value. The address counter 194 may be a timer which counts down or counts up to the predetermined time interval needed to read one address line. In decision diamond 224, the method determines whether the final address line associated with the particular way being read has been read. If the address counter 194 for the row has NOT reached the pre-defined value for the last address line or row of that particular way, the method proceeds to block 226. At block 226, the method provides for the address counter 194 to continue the address counter for that particular address line associated with a particular way. After block 226, the method proceeds to block 228, where the method proceeds to the next row and resetting the address counter. If the address counter 194 for the row has reached the pre-defined value for the last address line or row of that particular way, the method proceeds to decision diamond 230.

At decision diamond 230, it is determined whether the march test is complete. If the march test is complete then the march test is ended and the method is completed. However, if the march test is NOT complete, then the method proceeds to decision diamond 232.

At decision diamond 232, it is determined whether it would be necessary to select the next way to perform the 6N march test algorithm. If it is determined that the next way should be selected, then the method proceeds to block 212 to engage the read counter 196, the word counter 198 and the address counter 194 as described above. If it is determined that the next way should NOT be selected, the method proceeds to process block 234.

At block 234, the method provides for engaging the next march test element of the 6N march test algorithm. Recall that the operations performed by process block 208 is only related to the read operations which may be associated with the march test algorithm performed by the method 200.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An SRAM read system for performing read operation for an SRAM unit, comprising:
   a first SRAM way within the SRAM unit, said first SRAM way including a plurality of first memory rows resident on said first SRAM way, in which each of said plurality of first memory rows includes a plurality of first memory words;
   a first read control module coupled to said first SRAM way, said first read control module configured to read said plurality of first memory words;
   a second SRAM way within the SRAM unit, said second SRAM way including a plurality of second memory rows resident on said second SRAM way, in which each of said plurality of second memory rows includes a plurality of second memory words;
   a second read control module coupled to said second SRAM way, said second read control module configured to read said plurality of second memory words; and
   a read control system coupled to said first read control module and said second read control module, said read control system configured to establish way select read control and word select read control.

2. The SRAM read system of claim 1 wherein said read control system further comprises a read logic controller resident within said read control system and operatively coupled to said first read control module and said second read control module, said read control system configured to provide the logic to perform read operations for the SRAM unit.

3. The SRAM read system of claim 2 wherein said read logic controller further comprises a way select control function operatively coupled to said SRAM unit, said way selection control function configured to select either said first SRAM way or said second SRAM way.

4. The SRAM read system of claim 3 further comprising a way select macro, said way select macro resident on said SRAM unit and operatively coupled to said way select control function, said way select macro configured to select either said first SRAM way or said SRAM second way.

5. The SRAM read system of claim 3 wherein said read logic controller further comprises a word select control function operatively to said SRAM unit, said word select control function configured to select said plurality of first memory words and said plurality of second memory words to be read.

6. The SRAM read system of claim 2 wherein said read logic controller further comprises a word select control function operatively coupled to said SRAM unit, said word selection control function configured to select said plurality of first memory words and said plurality of second memory words to read.

7. The SRAM read system of claim 6 further comprising a word select macro, said word select macro resident on said SRAM unit and operatively coupled to said word select control function, said word select macro configured to select said plurality of first memory words and said plurality of second memory words to read.

8. The SRAM read system of claim 7 wherein said read control system further comprises a read counter operatively coupled to said read logic controller, said read counter configured to count shifts and at the proper time enable read operations.

9. The SRAM read system of claim 7 wherein said read control system further comprises a word counter operatively coupled to said read logic controller, said word counter configured to count the number of words read for said plurality of first memory rows and said plurality of second memory rows.

10. A method for reading an SRAM unit having at least two ways, each of said at least two ways having a plurality of rows, each of said plurality of rows having a plurality of words, each of said plurality of words having a plurality of memory bits, comprising:
   providing a way select control macro configured to select one of said at least two ways;
   providing a word select control macro configured to select one of said plurality of words;
   engaging a word counter having a word counter cycle;

engaging an address counter having an address counter cycle;

engaging a read counter having a read counter cycle;

determining whether a read counter cycle is complete;

conducting a read operation when said read counter cycle is complete, said read operation enabling said way select control;

determining whether a word counter cycle is complete;

performing read operations for the next row when said word counter cycle is complete; and determining whether an address counter cycle is complete.

11. The method of claim 10 wherein said method for reading an SRAM unit is engaged during read operations for a march test algorithm.

12. The method of claim 11 wherein said method for reading an SRAM unit is engaged during read operations for a 6N march test algorithm.

13. A method for performing read operations during a memory test algorithm for an SRAM unit having at least two ways, each of said at least two ways having a plurality of rows, each of said plurality of rows having a plurality of words, each of said plurality of words having a plurality of memory bits, comprising:

providing a way select control macro configured to select one of said at least two ways;

providing a word select control macro configured to select one of said plurality of words;

engaging a word counter having a word counter cycle;

engaging an address counter having an address counter cycle;

engaging a read counter having a read counter cycle;

determining whether a read counter cycle is complete;

conducting a read operation when said read counter cycle is complete, said read operation enabling said way select control;

determining whether a word counter cycle is complete;

performing a read operation for the next row when said word counter cycle is complete; and determining whether an address counter cycle is complete.

* * * * *